United States Patent
Ha et al.

(10) Patent No.: US 8,405,197 B2
(45) Date of Patent: Mar. 26, 2013

(54) INTEGRATED CIRCUIT PACKAGING SYSTEM WITH STACKED CONFIGURATION AND METHOD OF MANUFACTURE THEREOF

(75) Inventors: Jong-Woo Ha, Seoul (KR); DaeSik Choi, Seoul (KR); Byoung Wook Jang, Yong-in (KR)

(73) Assignee: STATS ChipPAC Ltd., Singapore (SG)

( * ) Notice: Subject to any disclaimer, the term of this patent is extended or adjusted under 35 U.S.C. 154(b) by 13 days.

(21) Appl. No.: 12/410,983

(22) Filed: Mar. 25, 2009

(65) Prior Publication Data

US 2010/0244217 A1    Sep. 30, 2010

(51) Int. Cl.
*H01L 21/58* (2006.01)
*H01L 23/492* (2006.01)

(52) U.S. Cl. . 257/686; 257/698; 257/777; 257/E23.011; 257/E23.174; 257/E21.597; 438/109; 438/667

(58) Field of Classification Search ............... 257/621, 257/686, 698, 777, E25.03, E23.011, E23.174, 257/E21.597; 438/109, 667, 126
See application file for complete search history.

(56) References Cited

U.S. PATENT DOCUMENTS

| | | | | |
|---|---|---|---|---|
| 5,825,080 A * | 10/1998 | Imaoka et al. | | 257/659 |
| 7,253,511 B2 | 8/2007 | Karnezos et al. | | |
| 7,317,256 B2 | 1/2008 | Williams et al. | | |
| 7,446,420 B1 | 11/2008 | Kim | | |
| 7,544,605 B2 * | 6/2009 | Sparks et al. | | 438/622 |
| 7,687,896 B2 * | 3/2010 | Shibata | | 257/686 |
| 7,741,723 B2 * | 6/2010 | Uchida | | 257/777 |
| 7,750,452 B2 * | 7/2010 | Do et al. | | 257/686 |
| 2005/0167812 A1 * | 8/2005 | Yoshida et al. | | 257/686 |
| 2007/0210432 A1 | 9/2007 | Cablao et al. | | |
| 2007/0290300 A1 * | 12/2007 | Kawakami | | 257/621 |
| 2008/0036082 A1 * | 2/2008 | Eun | | 257/737 |
| 2008/0128883 A1 * | 6/2008 | Lee | | 257/686 |
| 2008/0157322 A1 * | 7/2008 | Tang et al. | | 257/686 |
| 2008/0237888 A1 * | 10/2008 | Hayasaka et al. | | 257/777 |
| 2008/0272476 A1 * | 11/2008 | Do et al. | | 257/686 |
| 2009/0008798 A1 * | 1/2009 | Yoshida et al. | | 257/777 |
| 2009/0014891 A1 * | 1/2009 | Chang et al. | | 257/777 |
| 2009/0032966 A1 * | 2/2009 | Lee et al. | | 257/774 |
| 2009/0051012 A1 * | 2/2009 | Maebashi | | 257/621 |
| 2009/0302435 A1 * | 12/2009 | Pagaila et al. | | 257/659 |
| 2010/0140783 A1 * | 6/2010 | Do et al. | | 257/692 |
| 2010/0230822 A1 * | 9/2010 | Pagaila et al. | | 257/773 |
| 2010/0283140 A1 * | 11/2010 | Kim et al. | | 257/686 |
| 2011/0175222 A1 * | 7/2011 | Kim et al. | | 257/738 |
| 2011/0309526 A1 * | 12/2011 | Cho et al. | | 257/777 |

* cited by examiner

*Primary Examiner* — George Fourson, III
(74) *Attorney, Agent, or Firm* — Ishimaru & Associates LLP

(57) ABSTRACT

A method of manufacture of an integrated circuit packaging system includes: providing a first stack layer including a first device over a first substrate, the first device including a through silicon via; configuring a second stack layer over the first stack layer, the second stack layer including an analog device; configuring a third stack layer over the second stack layer; and encapsulating the integrated circuit packaging system.

20 Claims, 4 Drawing Sheets

INTEGRATED CIRCUIT PACKAGING SYSTEM WITH STACKED CONFIGURATION AND METHOD OF MANUFACTURE THEREOF

TECHNICAL FIELD

The present invention relates generally to an integrated circuit packaging system, and more particularly to a system for three-dimensional vertical integration of stacked electronic devices and/or packages.

BACKGROUND ART

Integrated circuits and integrated circuit packaging systems can be found in a multitude of portable electronic devices, such as smart phones, pocket PCs, digital cameras, location based devices, and other wireless products. Today's customers and electronics systems are demanding that these integrated circuit systems provide maximum functional integration of memory and logic within the smallest footprint, lowest profile, and lowest cost package available. Consequently, manufacturers are turning to three-dimensional packaging to achieve the required high level of functional integration necessary to support these mobile multimedia products.

Various techniques, such as, stacked-die-packages (SDP), stacked packages (SP), and multi-package-modules (MPM), have been developed to meet the continued demands for improving functional integration. Although stacked-die-packaging and stacked packaging techniques can minimize a devices footprint area, the profile height and the package interconnections of SDP and SP methods can become a limiting factor as the circuit density of the package increases. For example, the use of adhesives and spacers within SDP and SP configurations, along with bond wire interconnects to the overlying structures, can cause unwanted increases in package size.

Furthermore, although MPM techniques improve circuit density and package level functional integration, they often suffer from an increased profile thickness, a larger footprint area, and complicated fabrication methods. Commonly, these complicated fabrication methods can lead to increased production costs, which can make a product prohibitively expensive.

Thus, a need still remains for a reliable integrated circuit packaging system, method of fabrication, and device design, wherein the integrated circuit packaging system exhibits a high level of functional integration, decreased package size, and ease of manufacturability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a first stack layer including a first device over a first substrate, the first device including a through hole via; configuring a second stack layer over the first stack layer, the second stack layer including an analog device; configuring a third stack layer over the second stack layer; and encapsulating the integrated circuit packaging system.

The present invention provides an integrated circuit packaging system, including: a first stack layer including a first device over a first substrate, the first device including a through hole via; a second stack layer over the first stack layer, the second stack layer including an analog device; a third stack layer over the second stack layer; and an encapsulation material.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
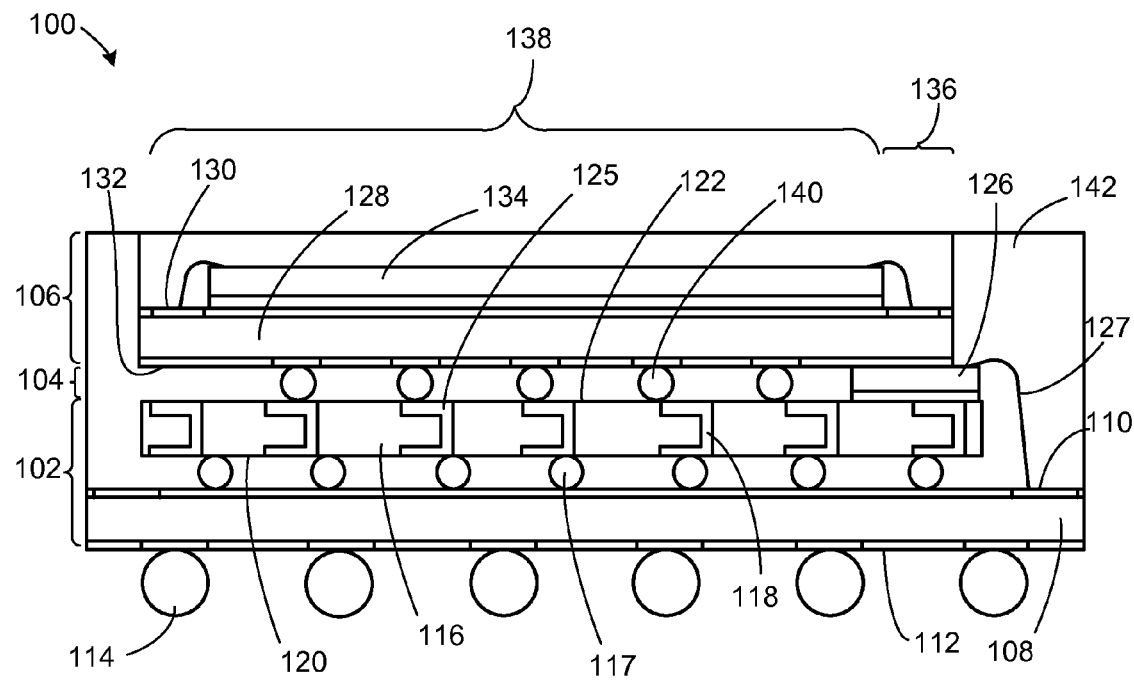
FIG. 1 is a partial cross-sectional view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the conventional plane or surface of the first substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements and may or may not include an adhesive formed therebetween.

The term "processing" as used herein includes deposition of material or photoresist, patterning, exposure, development, etching, cleaning, and/or removal of the material or photoresist as required in forming a described structure.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first", "second", and "third" as used herein are for purposes of differentiation between elements only and are not to be construed as limiting the scope of the present invention.

FIGS. 1-10, which follow, depict by way of example and not by limitation, exemplary embodiments for the formation of an integrated circuit packaging system and they are not to be construed as limiting. It is to be understood that a plurality of conventional processes that are well known within the art and not repeated herein, may precede or follow FIGS. 1-10. Moreover, it is to be understood that many modifications, additions, and/or omissions may be made to the below described processes and/or embodiments without departing from the scope of the claimed subject matter. For example, the below described processes and/or embodiments may include more, fewer, or other steps. Additionally, steps may be performed in any suitable order without departing from the scope of the present invention.

Moreover, it is to be appreciated that the integrated circuit packaging system of the present disclosure may include any number of stacked devices and/or packages, such as but not limited to, memory circuits, logic circuits, analog circuits, digital circuits, passive circuits, RF circuits, or a combination thereof, for example. Moreover, it is to be understood that the integrated circuit packaging system manufactured by the embodiments described herein can be used within processor components, memory components, logic components, digital components, analog components, mixed-signal components, power components, radio-frequency (RF) components, digital signal processor components, micro-electromechanical components, optical sensor components, or a combination thereof in numerous configurations and arrangements as may be needed.

Furthermore, it is to be understood that one or more of the integrated circuit packaging system could be prepared at one time on a medium, which could be separated into individual or multiple integrated circuit package assemblies at a later stage of fabrication.

Generally, the following embodiments relate to a stacked packaging structure. In at least one embodiment, the stacked packaging structure may include a through silicon via device formed over a first substrate within a package-in-package structure, wherein an internal stacking module can be formed over the through silicon via device and directly connected to the top surface of the through silicon via device. As such, the method, device, and/or system of the present embodiments permits a reduction in height of the stacked package structure by eliminating the need for spacers between the through silicon via device and the internal stacking module.

Referring now to FIG. 1, therein is shown a partial cross-sectional view of an integrated circuit packaging system 100 in a first embodiment of the present invention.

In one embodiment, the integrated circuit packaging system 100 can be described as an alternative package-in-package configuration, i.e., a three-dimensional package that stacks fully tested packages, packaged chips, bare die, and/or internal stacking modules on top of a Base Assembly Package (BAP). Generally, and by way of example, the internal stacking module may include a standard land grid array that can stack multiple memory, while the BAP may include a standard ball grid array with one or more digital, analog, or hybrid circuits, e.g., a microprocessor, a microcontroller, an Application Specific Integrated Circuit (ASIC), a static or dynamic memory device, a radio frequency integrated circuit, or a combination thereof.

The integrated circuit packaging system 100 may include a first stack layer 102, a second stack layer 104, and a third stack layer 106. The first stack layer 102, also referred to as a base assembly package, may further include a first substrate 108 with a first surface 110 positioned parallel and opposing a second surface 112.

In one embodiment, the first substrate 108 may include a semiconductor substrate or a multi-layer structure (e.g., a laminate with one or more conductive layers separated by an insulator) suitable for electrically interconnecting integrated circuit systems formed on the first surface 110 of the first substrate 108 to external electrical circuits. In other embodiments, the first substrate 108 may include a thin metal sheet (e.g., a leadframe) or a conductive plated pattern on plastic tape suitable for electrically interconnecting integrated circuit systems formed on the first surface 110 of the first substrate 108 to external electrical circuits.

However, it is to be understood that the first substrate 108 is not to be limited to these examples. In accordance with the invention, the first substrate 108 may include any electrical interconnection structure that facilitates the incorporation of the integrated circuit packaging system 100 into a higher-level assembly, such as a printed circuit board or other suitable structure for supporting and/or electrically interfacing with the integrated circuit packaging system 100. As an exemplary illustration, the second surface 112 of the first substrate 108 may also be designed/engineered to electrically interface with another package structure, such as another one of the integrated circuit packaging system 100.

In at least one embodiment, the second surface 112 of the first substrate 108 may include an external terminal 114, such as a solder ball formed as part of a ball grid array structure or other surface mount technology well known within the art. The external terminal 114 provides an electrical interface or interconnection between the integrated circuit packaging system 100 and external electrical circuits. More specifically, an electrical trace system within the first substrate 108 can receive an electrical signal from the external terminal 114 and transmit the electrical signal between the second surface 112 and the first surface 110 of the first substrate 108 or vice versa. Although the present embodiment depicts the external terminal 114 as a solder ball, it is to be understood that the external terminal 114 may include any interface connection technology, such as a pin or land grid array, that establishes electrical contact between the integrated circuit packaging system 100 and external electrical circuits.

Formed over the first surface 110 of the first substrate 108 is a first device 116. The first device 116 can be electrically attached to the first substrate 108 by one or more of a terminal 117. It will be appreciated by those skilled in the art that the terminal 117 can be formed by common surface mount technologies well known within the art and not described herein. In such cases, a through hole via 118 (described below) of the first device 116 can be electrically interfaced with the first substrate 108 by a solder bump, for example. In at least one embodiment, the terminal 117 can be encapsulated by a zero fillet resin material (not shown) that prevents offset of wire bonds formed adjacent the first device 116.

Generally, the first device 116 may include one or more active devices, passive devices, or a combination thereof. By way of example, and not by way of limitation, the first device 116 may include one or more semiconductor chips or die that transmit, receive, and/or modulate electrical signals, such as stacked devices, modular devices, ASIC devices, memory devices, RF devices, analog devices, or a combination thereof. Furthermore, the first device 116 may further include, by way of example and not by way of limitation, one or more integrated circuit packages that transmit, receive, and/or modulate electrical signals, such as leaded and non-leaded packages, internal stacking module packages, flip-chip packages, modular packages, application-specific-integrated-circuit (ASIC) packages, RF packages, analog packages, memory packages, stacked die packages, or a combination thereof.

However, it is to be understood that the first device 116 covers a wide range of semiconductor chip and integrated circuit package configurations involving various sizes, dimensions, and functional applications, and the type of chip or package configuration employed should only be limited by the design specifications of the integrated circuit package.

Moreover, it will be appreciated by those skilled in the art that the present embodiments permit the testing of the first device 116 before adhering it to the first substrate 108, thereby ensuring the use of known good die or packages in the manufacturing process. Additionally, after adhering the first device 116 to the first substrate 108, this assembly can also be tested before incorporation into additional package systems. This ensures that the final product includes known good assemblies, thereby improving the manufacturing process yield for the integrated circuit packaging system 100.

In at least one embodiment, regardless of the type of device chosen for the first device 116, the first device 116 may include one or more of the through hole via 118 that extends from and provides an electrical interconnection between a bottom surface 120 and a top surface 122 of the first device 116.

It will be appreciated by those skilled in the art that the through hole via 118 can be formed by one or more various processes including, but not limited to, a wet etch process, a dry etch process, laser ablation, and/or a similar process, and filled with a conductive material. In at least one embodiment, the through hole via 118 can be filled with a metallic material, such as, tungsten, aluminum, copper, titanium, tantalum, and combinations thereof. In other embodiments, the through hole via 118 can be filled with a solder paste. However, it is to be understood that the method and materials used to form the through hole via 118 are not essential, what is important is that the first device 116 include one or more of the through hole via 118 to provide an electrical interconnection between the first substrate 108 and overlying devices.

Generally, the distance between each of the through hole via 118 can be optimized to suit the particular application. For example, in one embodiment, the through hole via 118 can be closely spaced to maximize or increase the interconnect density of the through hole via 118 for purposes of improving circuit density. In another embodiment, the through hole via 118 can be strategically configured to minimize impedance and noise interference while maximizing routing strategies for faster clock speeds and thus faster processing. In yet another embodiment, the through hole via 118 can be strategically configured to isolate structures of devices sensitive to electromagnetic radiation/interference.

It will be appreciated by those skilled in the art that the minimum distance between the through hole via 118 is currently only limited by the technology node used to manufacture the integrated circuit packaging system 100.

Moreover, it is to be understood that the through hole via 118 may include any shape such as a rectangle, circle, ellipse, cross, triangle, or combinations thereof, for example. Moreover, it is to be understood that the through hole via 118 may include any configuration such as, a conductive strip, or a dense, semi-dense, isolated, or random array structure, for example.

Generally, the through hole via 118 can provide electrical interconnections to devices within the first stack layer 102, the second stack layer 104, the third stack layer 106, or combinations thereof. For example, the through hole via 118 can provide electrical interconnections between the first substrate 108 and the first device 116, between the first stack layer 102 and the second stack layer 104, and/or between the first stack layer 102, the second stack layer 104, and the third stack layer 106.

It will be appreciated by those skilled in the art that the through hole via 118 provides numerous aspects. One such aspect is that the through hole via 118 of the present embodiments increases the response speed of the integrated circuit packaging system 100 by utilizing a through via structure and a direct interconnection by bump bond instead of wire bonding. Another aspect is that the through hole via 118 permits device and/or package stacking without spacers or adhesives because bump bonding can be used for interconnections with the through hole via 118. Another aspect is that the through hole via 118 enables a simpler manufacturing method because of the elimination of the need for wire bonding, spacers, and/or adhesives. Yet another aspect is that the through hole via 118 permits a reduction in the profile of the integrated circuit packaging system 100 by eliminating the need for wire bonding, spacers, and/or adhesives. Yet still, another aspect is that the through hole via 118 permits the use of known good device (KGD) because after attaching the first device 116 to the first substrate 108, the first device 116 can be tested.

Moreover, it will be appreciated by those skilled in the art that by utilizing the through hole via 118 that numerous offset stacking configurations can be employed by the integrated circuit packaging system 100 because bond wire clearance is no longer an issue. For example, by employing direct bump bond technology with the through hole via 118, additional spacer formations and adhesive layers are not required to accommodate bond wire loop height requirements. Accordingly, the complexity of interconnecting the first stack layer 102, the second stack layer 104 and the third stack layer 106 can be reduced and the in-line process cycle time for the integrated circuit packaging system 100 can also be improved because the wire bond process cycle time can be reduced.

The top surface 122 of the first device 116 may include one or more regions for locating devices of the second stack layer 104 and one or more regions for locating a contact pad 125 that provides electrical interconnect sites for overlying devices. It will be appreciated by those skilled in the art that the contact pad 125 may include electrical traces.

Formed over or on the first stack layer 102 is the second stack layer 104. In at least one embodiment, the second stack layer 104 can be offset stacked over or on the first stack layer 102 to accommodate an interconnection 127 connected at the periphery of an analog device 126. The second stack layer 104 may include passive device structures, including but not limited to, resistors, capacitors, inductors, or combinations thereof. In at least one embodiment, the second stack layer 104 may include one or more of the analog device 126. The analog device 126 can be attached to the first device 116 by an adhesive well known in the art and not described herein.

Generally, the analog device 126 can be located along the periphery of the first device 116, thereby permitting the interconnection 127, such as a bond wire, to provide an electrical pathway and directly connect the first substrate 108 and the analog device 126. The interconnection 127 can be deposited using materials and techniques well known within the art and is currently only limited by the technology of wire bond equipment and the minimum required operating space.

In at least one embodiment, the interconnection 127 can be strategically located along one or more of a periphery of the analog device 126 to ease the process manufacturing latitude for placing the third stack layer 106 over the second stack layer 104. For example, by locating the interconnection 127 on one side of the analog device 126, the third stack layer 106 need only be offset from a single formation of the interconnection 127, thereby enabling more products to meet the specified design requirements of the integrated circuit packaging system 100.

Moreover, it will be appreciated by those skilled in the art that the offset stacking configuration employed by the integrated circuit packaging system 100 can also reduce the complexity of the interconnection 127 formation process. For example, by offset stacking, additional spacer formations and adhesive layers are not required to provide bond wire loop height clearance for the interconnection 127. Accordingly, the complexity of the interconnection 127 formation process is reduced and the in-line process cycle time for the integrated circuit packaging system 100 can be improved (i.e., reduced).

In at least one embodiment, the analog device 126 can be located flush with the edge or boundary of the first device 116 because a wire bond is not employed to electrically connect the first device 116 to the first substrate 108. Such a configuration frees up critical space for placement of other electrical interconnections or devices.

In other embodiments, the analog device 126 can be electrically attached to the first device 116 by surface mount technology well known within the art and not described herein. In such cases, the analog device 126 can be located anywhere over or on the first device 116. In yet other embodiments, the analog device 126 can be electrically interconnected by a combination of surface mount technology and the interconnection 127.

Formed over or on the second stack layer 104 is the third stack layer 106. In at least one embodiment, the third stack layer 106 can be offset stacked over or on the second stack layer 104 to accommodate the interconnection 127 connected at the periphery of the analog device 126. In some embodiments, the third stack layer 106 covers at least some portion of the analog device 126.

The third stack layer 106, which can be referred to as an offset package, may further include a second substrate 128 with a first surface 130 positioned parallel and opposing a second surface 132. Formed over the first surface 130 of the second substrate 128 is a second device 134. The second device 134 may include active devices, passive devices, or a combination thereof. By way of example, and not by way of limitation, the second device 134 may include one or more semiconductor chips or die that transmit, receive, and/or modulate electrical signals, such as stacked devices, modular devices, ASIC devices, memory devices, RF devices, analog devices, or a combination thereof. Furthermore, the second device 134 may further include, by way of example and not by way of limitation, one or more integrated circuit packages that transmit, receive, and/or modulate electrical signals, such as leaded and non-leaded packages, internal stacking module packages, flip-chip packages, modular packages, application-specific-integrated-circuit (ASIC) packages, RF packages, analog packages, memory packages, stacked die packages, or a combination thereof.

However, it is to be understood that the second device 134 covers a wide range of semiconductor chip and integrated circuit package configurations involving various sizes, dimensions, and functional applications, and the type of chip or package configuration employed should only be limited by the design specifications of the integrated circuit package.

Moreover, it will be appreciated by those skilled in the art that the present embodiments permit the testing of the second device 134 before adhering it to the second substrate 128, thereby ensuring the use of known good die or packages in the manufacturing process. Additionally, after adhering the second device 134 to the second substrate 128, this assembly can also be tested before incorporation into additional package systems. This ensures that the final product includes known good assemblies, thereby improving the manufacturing process yield for the integrated circuit packaging system 100.

In at least one embodiment, the second substrate 128 can be aligned over or directly on the analog device 126 such that a first portion 136 of the second substrate 128 rests over or on the analog device 126, while a second portion 138 of the second substrate 128 overhangs the first device 116 and rests on a system interconnect 140. As such, the system interconnect 140 formed between the first device 116 and the second substrate 128 not only provides an electrical interconnection, but also provides a measurable amount of support to the second portion 138 of the second substrate 128 overhanging the first device 116.

In other embodiments, an underfill material can be formed between the second portion 138 of the second substrate 128 and the first device 116 surrounding the system interconnect 140, thereby further providing structural support to the second portion 138 of the second substrate 128, while electrically insulating the system interconnect 140. The underfill material may also help to reduce the amount of warpage that the integrated circuit packaging system 100 may encounter during thermal cycling. In some embodiments the underfill material may include an encapsulation material 142.

It is to be understood that the system interconnect 140 may include an array of electrical contacts aligned over and corresponding with the through hole via 118 and/or the contact pad 125 of the first device 116, thereby providing an electrical interconnection between the first stack layer 102 and the third stack layer 106. For illustrative purposes, the system interconnect 140 may include structures such as a solder ball, a solder column interposer, or a stud bump.

It will be appreciated by those skilled in the art that this stair stack package configuration provides various three-dimensional integration schemes and alternative design structures for package-in-package designs, while maintaining a low profile for the integrated circuit packaging system 100. For example, by offsetting the third stack layer 106, the vertical dimension of the integrated circuit packaging system 100 can be reduced by not requiring the placement of the second substrate 128 to accommodate the bond wire loop height of the analog device 126, thereby helping to maintain a low profile for the integrated circuit packaging system 100. Additionally, by way of example, the vertical dimension of the integrated circuit packaging system 100 can be reduced by not requiring the use of spacers and adhesive layers to separate and help support the third stack layer 106.

Moreover, it will be appreciated by those skilled in the art that the present embodiment reduces the footprint space required for mounting the integrated circuit packaging system 100 on a printed circuit board (not shown). For example, by utilizing the system interconnect 140 to electrically connect the third stack layer 106 to the first stack layer 102, wire bonds are not needed to connect the third stack layer 106 to the first substrate 108.

It will be further appreciated by those skilled in the art that the system interconnect 140 need only be offset from the analog device 126 and the interconnection 127 by a distance that is currently only limited by unwanted electrical interference occurrences.

Yet still, it will be appreciated by those skilled in the art that the through hole via 118 and the system interconnect 140 permits a direct connection that improves device speed, while eliminating the need for spacers and adhesives, thereby helping to reduce the profile of the integrated circuit packaging system.

After forming the third stack layer 106 over or on the second stack layer 104 and electrically interconnecting with the system interconnect 140, the encapsulation material 142 can be deposited by well known methods and techniques within the art and not described herein. In at least one embodiment, the encapsulation material 142 is deposited in such a manner so as to leave the second surface 112 of the first substrate 108 exposed. In some embodiments, after depositing the encapsulation material 142, the integrated circuit packaging system 100 can be described as a package-in-package system.

It is to be understood that although the integrated circuit packaging system 100 is shown with three stacking layers, the integrated circuit packaging system 100 may include any number of stacked layers.

Thus, it has been discovered that the integrated circuit packaging system 100 and device of the present invention furnish important and heretofore unknown and unavailable solutions, capabilities, and functional aspects for reducing the overall package height of the integrated circuit packaging system. The present embodiments achieve the overall reduced package height by eliminating the need for additional spacers and/or adhesive layers. Moreover, by eliminating the need for additional spacers and/or adhesive layers, the manufacturing process can be further simplified and the costs of production can be lowered.

Figure 2:
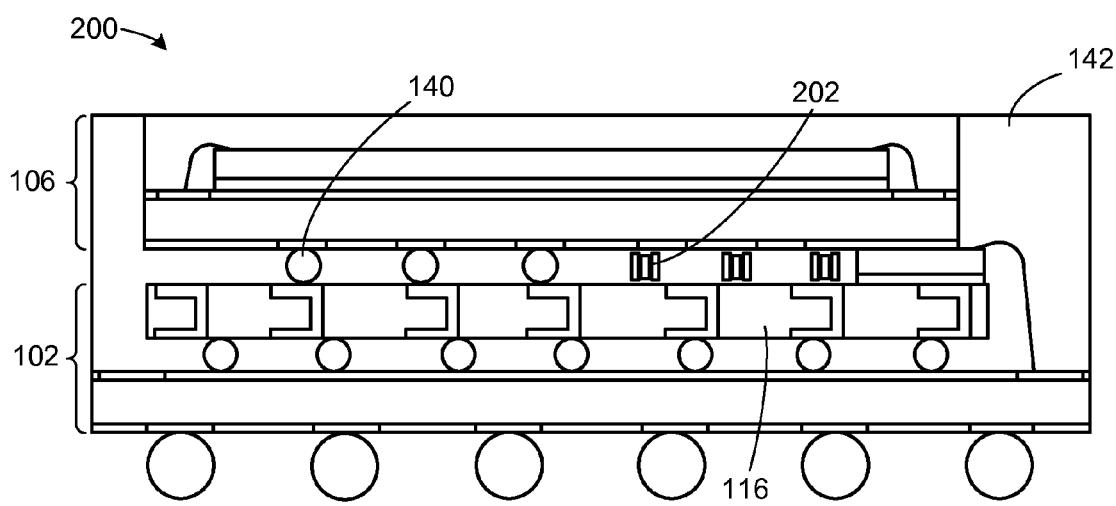
FIG. 2 is a partial cross-sectional view of an integrated circuit packaging system in accordance with another embodiment of the present invention.
Figure 3:
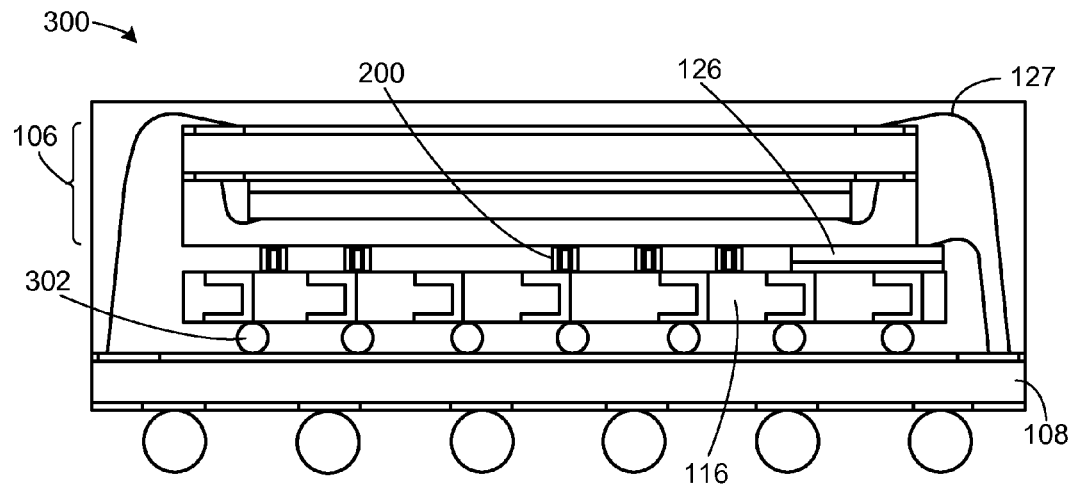
FIG. 3 is a partial cross-sectional view of an integrated circuit packaging system in accordance with another embodiment of the present invention.

Referring now to FIGS. 2-3. FIGS. 2-3 include some of the same reference numbers used to describe the integrated circuit packaging system 100 in FIG. 1 and the process steps of FIG. 1. It is noted that the layers, devices, packages, configurations, and process steps corresponding to such reference numbers generally include the same characteristics (e.g., function, purpose, process techniques, etc.) as those described in reference to FIG. 1 and, therefore, their descriptions are not reiterated in detail for FIGS. 2-3. Rather the descriptions of the layers, devices, packages, configurations, and process steps corresponding to reference numbers in FIG. 1 are incorporated for the same reference numbers included in FIGS. 2-3.

Referring now to FIG. 2, therein is shown a partial cross-sectional view of an integrated circuit packaging system 200 in accordance with another embodiment of the present invention. Per this embodiment, some of the system interconnect 140 can be replaced with a passive device 202.

Generally, the passive device 202 may include, but is not limited to, resistors, capacitors, inductors, or combinations thereof. In some embodiments, the passive device 202 may also serve as a spacer structure separating the first stack layer 102 and the third stack layer 106. The passive device 202 can be formed on the first device 116 without impeding the system interconnect 140 while spaced such that the encapsulation material 142 or underfill material fills the space between each of the passive device 202.

Some or all of the passive device 202 may be electrically connected only to the first device 116. In other embodiments, some or all of the passive device 202 may also be electrically, as well as mechanically, connected to the first device and the third stack layer 106. It will be appreciated by those skilled in the art that a matrix of interconnects and distribution may be formed with the passive device 202 allowing signals to flow within and between each of the stack layers of the integrated circuit packaging system 200.

Referring now to FIG. 3, therein is shown a partial cross-sectional view of an integrated circuit packaging system 300 in accordance with another embodiment of the present invention. Per this embodiment, the third stack layer 106, which may include an internal stacking module with a land grid array, can be inverted and electrically connected to the first substrate 108 by the interconnection 127 (e.g., a bond wire) and all of the system interconnect 140 (not shown) can be replaced with one or more of the passive device 202. Additionally, the first device 116 can be electrically connected to the first substrate 108 by the terminal 117.

In at least one embodiment, the analog device 126 can be located flush with the edge or boundary of the first device 116 because a wire bond is not employed to electrically connect the first device 116 to the first substrate 108. Such a configuration frees up critical space for placement of the passive device 202.

Referring now to FIGS. 4-7, FIGS. 4-7 include some of the same reference numbers used to describe the integrated circuit packaging system 100 and 200 in FIGS. 1 and 2 and the process steps of FIG. 1. It is noted that the layers, devices, packages, configurations, and process steps corresponding to such reference numbers generally include the same characteristics (e.g., function, purpose, process techniques, etc.) as those described in reference to FIGS. 1 and 2 and, therefore, their descriptions are not reiterated in detail for FIGS. 4-7. Rather the descriptions of the layers, devices, packages, configurations, and process steps corresponding to reference numbers in FIGS. 1 and 2 are incorporated for the same reference numbers included in FIGS. 4-7.

Figure 4:
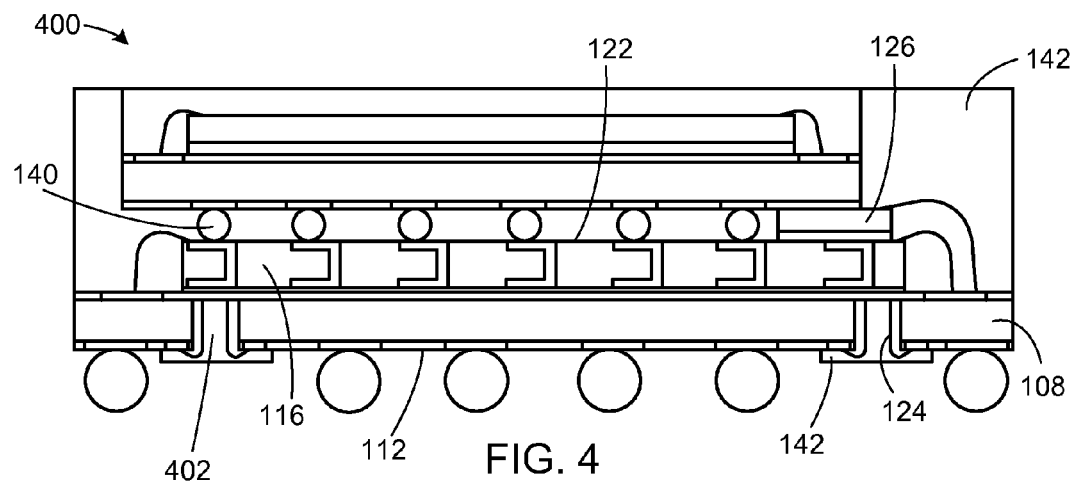
FIG. 4 is a partial cross-sectional view of an integrated circuit packaging system in accordance with another embodiment of the present invention.

Referring now to FIG. 4, therein is shown a partial cross-sectional view of an integrated circuit packaging system 400 in accordance with another embodiment of the present invention. Per this embodiment, the interconnection 127 that electrically connect the first device 116 to the first surface 110 of the first substrate 108 are relocated to extend or traverse through a hole 402 in the first substrate 108 to the second surface 112 facing away from the first device 116. By relocating the interconnection 127 for the first device 116 to electrically connect to the second surface 112 of the first substrate 108 through the hole 402, the footprint of the of the integrated circuit packaging system 400 can be reduced. Additionally, relocating the interconnection 127 to electrically connect to the second surface 112 of the first substrate 108 frees up additional real estate on the top surface 122 of the first device 116.

In at least one embodiment, the analog device 126 can now be located flush with the edge or boundary of the first device 116 because the interconnection 127 are no longer located along the top surface 122 of the first device 116. Such a configuration frees up critical space for placement of the system interconnect 140.

During encapsulation, each of the hole 402 may also be filled with the encapsulation material 142 to protect the interconnection 127 from the external environment.

Figure 5:
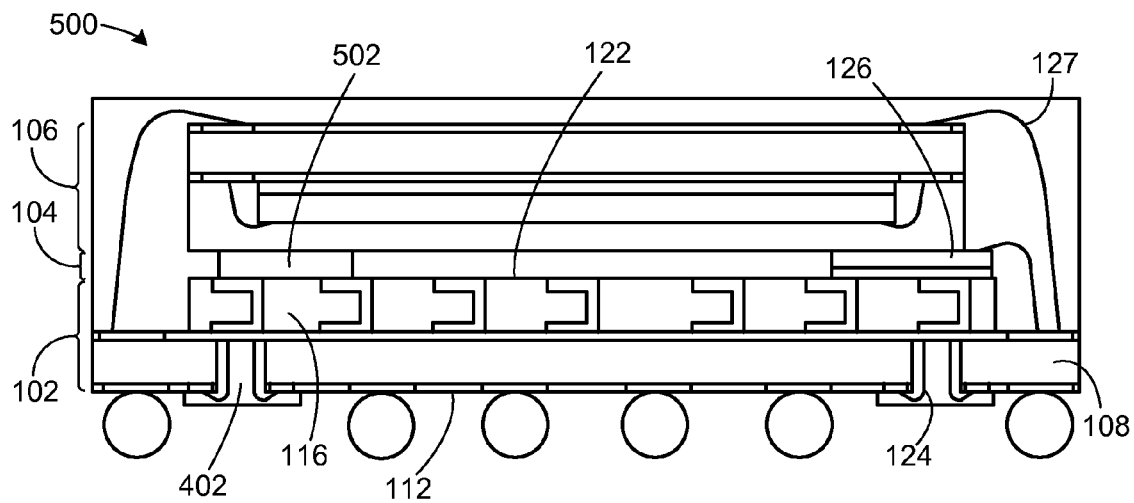
FIG. 5 is a partial cross-sectional view of an integrated circuit packaging system in accordance with another embodiment of the present invention.

Referring now to FIG. 5, therein is shown a partial cross-sectional view of an integrated circuit packaging system 500 in accordance with another embodiment of the present invention. Per this embodiment, the interconnection 127 that electrically connect the first device 116 to the first surface 110 of the first substrate 108 are relocated to extend or traverse through the hole 402 in the first substrate 108 to the second surface 112.

In at least one embodiment, the analog device 126 can now be located flush with the edge or boundary of the first device 116 because the interconnection 127 are no longer located along the top surface 122 of the first device 116. Such a configuration frees up critical space for attachment of the interconnection 127 of the third stack layer 106 to the first substrate 108.

Per this embodiment, the third stack layer 106, which may include an internal stacking module with a land grid array, can be inverted and stacked over or on the analog device 126 and a spacer 502. The third stack layer 106 can be electrically connected to the first substrate 108 by the interconnection 127 (e.g., a bond wire).

The system interconnect 140 (not shown) of previous embodiments can be replaced with one or more of the spacer 502 located within the second stack layer 104. In at least one embodiment, the spacer 502 can be used as a structure for supporting the third stack layer 106 by directly contacting the first stack layer 102 and the third stack layer 106. In other embodiments, the spacer 502 may also include a die attach material with or without thermally conducting capabilities, an electromagnetic interference shield for blocking potentially disruptive energy fields, an interposer for transmitting electrical signals, or a combination thereof.

Figure 6:
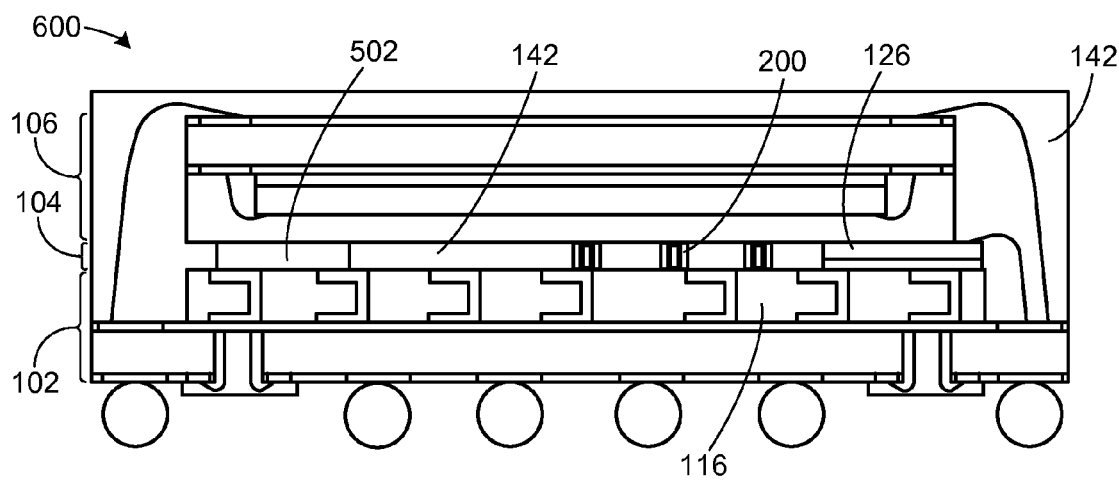
FIG. 6 is a partial cross-sectional view of an integrated circuit packaging system in accordance with another embodiment of the present invention.

Referring now to FIG. 6, therein is shown a partial cross-sectional view of an integrated circuit packaging system 600 in accordance with another embodiment of the present invention. This embodiment is similar to the structure and/or embodiment of FIG. 5 but additionally incorporates one or more of the passive device 202 formed within the second stack layer 104 along with the spacer 500 and the analog device 126.

Generally, the passive device 202 may include, but is not limited to, resistors, capacitors, inductors, or combinations thereof. In some embodiments, the passive device 202 may also serve as a spacer structure separating the first stack layer 102 and the third stack layer 106. The passive device 202 can be formed on the first device 116 such that the encapsulation material 142 or underfill material fills the space between each of the passive device 202.

Some or all of the passive device 202 may be electrically connected to the first device 116. Some or all of the passive device 202 may also be electrically, as well as mechanically, connected to the third stack layer 106. A matrix of interconnects and distribution may be formed with the passive device 202 allowing signals to flow within and between each of the stack layers of the integrated circuit packaging system.

Figure 7:
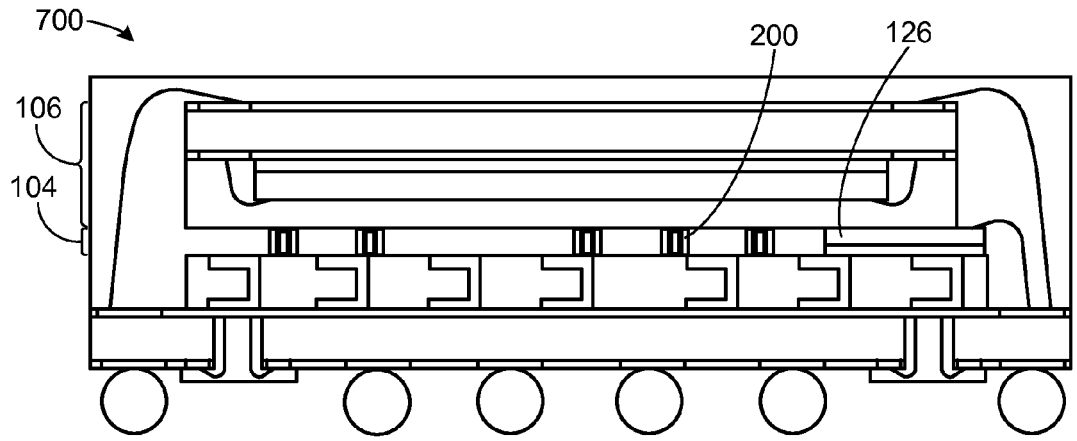
FIG. 7 is a partial cross-sectional view of an integrated circuit packaging system in accordance with another embodiment of the present invention.

Referring now to FIG. 7, therein is shown a partial cross-sectional view of an integrated circuit packaging system 700 in accordance with another embodiment of the present invention. This embodiment is similar to the structure and/or embodiments of FIGS. 5 and 6 without the spacer 500 (not shown) formed within the second stack layer 104. Per this embodiment, the second stack layer 104 includes one or more of the passive device 202 along with the analog device 126. Per this embodiment, the spacer 500 need not be formed within the second stack layer 104 because the passive device 202 may act as a mechanical support for the third stack layer 106 similar to the spacer 500, of FIGS. 5 and 6.

Figure 8:
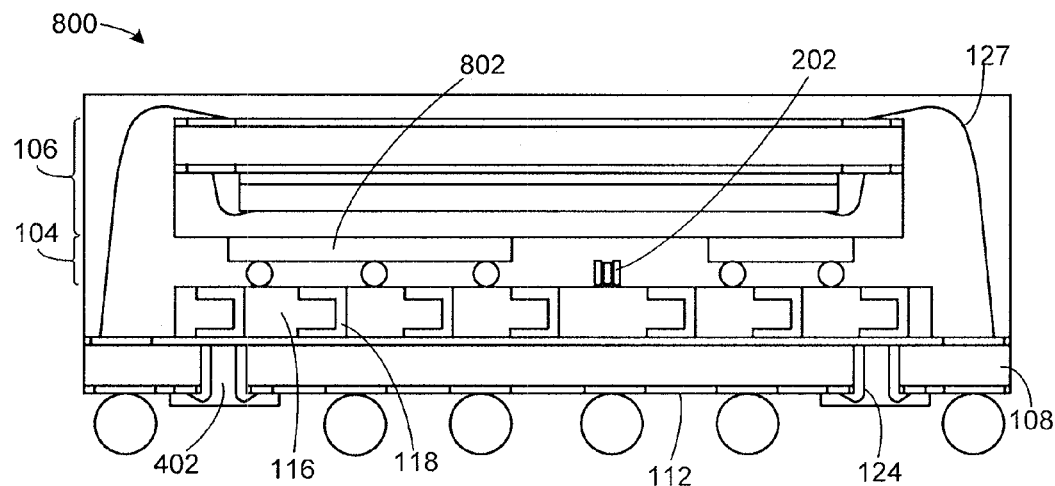
FIG. 8 is a partial cross-sectional view of an integrated circuit packaging system in accordance with another embodiment of the present invention.

Referring now to FIG. 8, therein is shown a partial cross-sectional view of an integrated circuit packaging system 800 in accordance with another embodiment of the present invention. Per this embodiment, the interconnection 127 that electrically connect the first device 116 to the first surface 110 of the first substrate 108 are relocated to extend or traverse through the hole 402 in the first substrate 108 to the second surface 112.

The third stack layer 106, which may include an internal stacking module with a land grid array, can be inverted and stacked over or on the second stack layer 104, which includes one or more of the passive device 202 and/or one or more of a system-in-package device 802. In at least one embodiment, one or more of the system-in-package device 802 can be electrically attached to the through hole via 118 of the first device 116 by a surface mount technology commonly known in the art and not repeated herein. The third stack layer 106 can be electrically connected to the first substrate 108 by the interconnection 127 (e.g., a bond wire).

It will be appreciated by those skilled in the art that the system-in-package device 802 not only enhances the functional integration of the integrated circuit packaging system 800 but it may also provide mechanical support for the third stack layer 106 formed over or on the second stack layer 104. Moreover, it will be appreciated by those skilled in the art that the second stack layer 104 including one or more of the system-in-package device 802 configuration provides various three-dimensional integration schemes and alternative design structures for package-in-package designs, while maintaining a low profile for the integrated circuit packaging system 800.

Figure 9:
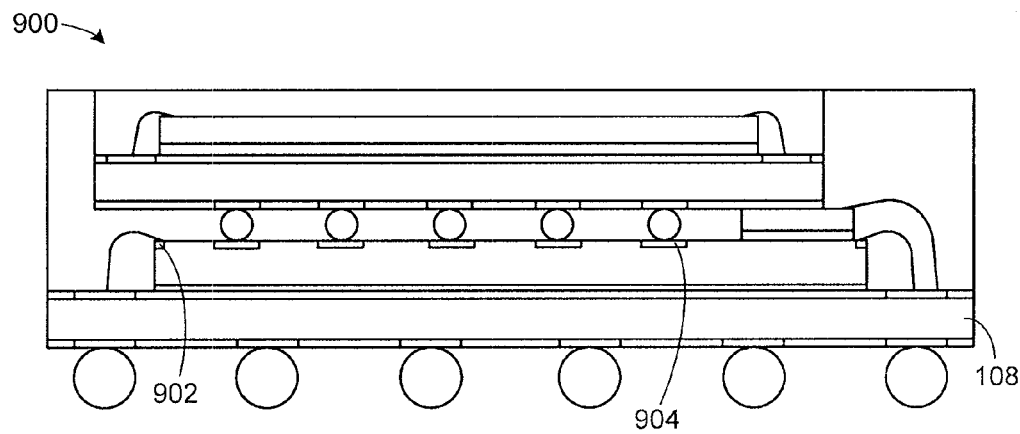
FIG. 9 is a partial cross-sectional view of an integrated circuit packaging system in accordance with another embodiment of the present invention.

Referring now to FIG. 9, therein is shown a partial cross-sectional view of an integrated circuit packaging system 900 in accordance with another embodiment of the present invention. This embodiment is similar to the structure and/or embodiment of FIG. 1 except that the first substrate 108 no longer includes the through hole via 118 (not shown). Per this embodiment, the first substrate 108 may include one or more of a redistribution layer with a bond pad 902 and a ball pad 904.

It will be appreciated by those skilled in the art that the redistribution layer can be used to redistribute signals from one location to another (e.g., from the bond pad 902 to the ball pad 904 and vice versa). Moreover, it will be appreciated by those skilled in the art that a redistribution layer can provide an inexpensive way to adapt one particularly configured device to several different packaging applications and assembly scenarios. As such, the redistribution layer can therefore provide flexibility to customize a particular device design to various applications. Furthermore, it will be appreciated by those skilled in the art that a redistribution layer may also help to ease the signal propagation delay inherent is some device designs. By using the redistribution layer, a device designer can be able to same size stack, reduce package size and be able to stack without a spacer.

Figure 10:
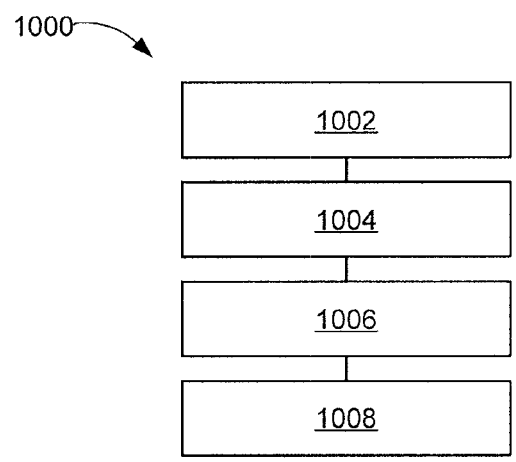
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system 100, 200, 300, 400, 500, 600, and 700 in a further embodiment of the present invention. The method 1000 includes: providing a first stack layer including a first device over a first substrate, the first device including a through hole via in a block 1002; configuring a second stack layer over the first stack layer, the second stack layer including an analog device in a block 1004; configuring a third stack layer over the second stack layer in a block 1006; and encapsulating the integrated circuit packaging system in a block 1008.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present invention thus has numerous aspects. One such aspect is that the present invention can reduce the overall package height by eliminating the use of spacers and adhesive materials between adjacent stacked layers.

Another aspect is that the present invention can simplify the manufacturing process by eliminating the use of spacers and adhesive materials that require extra process steps. Furthermore, by reducing the number of process steps, the overall manufacturing costs can be reduced as well.

Another aspect is that the present invention permits the use various three-dimensional integration schemes and alternative design structures for package-in-package designs, while maintaining a low profile for the integrated circuit packaging system by reducing the number of wire bonds.

Another aspect is that the present invention permits the use of alternative three-dimensional vertical stacking techniques by employing a through silicon via first device.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit packaging system comprising:
providing a first stack layer including a first device over a first substrate, the first device including a through hole via;
forming a second stack layer over the first stack layer, the second stack layer including an analog device along the periphery of the first device and electrically connected to the first substrate via a first interconnection; and
forming a third stack layer over the second stack layer, the third stack layer including an offset package directly on the analog device and a second device on a second substrate, the second substrate electrically connected to the first stack layer and partially supported by the analog device.

2. The method as claimed in claim 1 wherein:
providing the first device includes electrically connecting the first device to an external surface of the first substrate facing away from the first device through a hole in the first substrate.

3. The method as claimed in claim 1 wherein:
forming the third stack layer includes forming an inverted internal stacking module package electrically connected to the first substrate by a second interconnection.

4. The method as claimed in claim 1 wherein:
the method of manufacturing the integrated circuit packaging system includes forming a package-in-package configuration.

5. The method as claimed in claim 1 wherein:
providing the first stack layer includes electrically connecting the first device to the first substrate by a terminal.

6. The method as claimed in claim 1 wherein:
forming the third stack layer includes electrically connecting the third stack layer to the first substrate by a second interconnection.

7. The method as claimed in claim 1 wherein:
forming the third stack layer includes electrically connecting the third stack layer to the first device by a system interconnect.

8. The method as claimed in claim 1 wherein:
forming the second stack layer also includes forming a passive device or a spacer.

9. An integrated circuit packaging system comprising:
a first stack layer including a first device over a first substrate, the first device including a through hole via;
a second stack layer over the first stack layer, the second stack layer including an analog device along the periphery of the first device and electrically connected to the first substrate via a first interconnection; and
a third stack layer over the second stack layer, the third stack layer including an offset package directly on the analog device and a second device on a second substrate, the second substrate electrically connected to the first stack layer and partially supported by the analog device.

10. The system as claimed in claim 9 wherein:
the first device is electrically connected through a hole in the first substrate to an external surface of the first substrate facing away from the first device.

11. The system as claimed in claim 9 wherein:
the third stack layer includes an inverted internal stacking module package electrically connected to the first substrate by a second interconnection.

12. The system as claimed in claim 9 wherein:
the integrated circuit packaging system includes a package-in-package configuration.

13. The system as claimed claim 9 wherein:
the first device is electrically connected to the first substrate by a terminal.

14. The system as claimed in claim 9 wherein:
the third stack layer is offset stacked.

15. The system as claimed in claim 9 wherein:
the third stack layer is electrically connected to the first device by a system interconnect.

16. The system as claimed in claim 9 wherein:
the second stack layer also includes a passive device or a spacer.

17. A method of manufacture of an integrated circuit packaging system comprising:
  providing a first stack layer including a first device over a first substrate, the first device including a through hole via;
  configuring a second stack layer over the first stack layer, the second stack layer including a system-in-package device along the periphery of the first device and electrically connected to the first substrate via an interconnection; and
  configuring a third stack layer over the second stack layer, the third stack layer including an offset package directly on the system-in-package device and a second device on a second substrate, the second substrate electrically connected to the first stack layer and partially supported by the system-in-package device.

18. An integrated circuit packaging system comprising:
  a first stack layer including a first device over a firs substrate, the first device including a through hole via;
  a second stack layer over the first stack layer, the second stack layer including a system-in-package device along the periphery of the first device and electrically connected to the first substrate via an interconnection; and
  a third stack layer over the second stack layer, the third stack layer including an offset package directly on the system-in-package device and a second device on a second substrate, the second substrate electrically connected to the first stack layer and partially supported by the system-in-package device.

19. A method of manufacture of an integrated circuit packaging system comprising:
  providing a first stack layer including a first device over a first substrate, the first device including a redistribution layer;
  configuring a second stack layer over the first stack layer, the second stack layer including an analog device along the periphery of the first device and electrically connected to the first substrate via an interconnection; and
  configuring a third stack layer over the second stack layer, the third stack layer including an offset package directly on the analog device and a second device on a second substrate, the second substrate electrically connected to the first stack layer and partially supported by the analog device.

20. An integrated circuit packaging system comprising:
  a first stack layer including a first device over a first substrate, the first device including a redistribution layer;
  a second stack layer over the first stack layer, the second stack layer including an analog device along the periphery of the first device and electrically connected to the first substrate via an interconnection; and
  a third stack layer over the second stack layer, the third stack layer including an offset package directly on the analog device and a second device on a second substrate, the second substrate electrically connected to the first stack layer and partially supported by the analog device.

* * * * *